United States Patent
Flitsch et al.

[11] Patent Number: 6,136,669
[45] Date of Patent: Oct. 24, 2000

[54] MOBILE CHARGE IMMUNE PROCESS

[75] Inventors: Frederick Albert Flitsch, Cornwall; Min-Su Fung, Lagrangeville, both of N.Y.

[73] Assignee: International Business Machines Corporation, Armonk, N.Y.

[21] Appl. No.: 09/120,213

[22] Filed: Jul. 21, 1998

[51] Int. Cl.⁷ .................................................. H01L 21/326
[52] U.S. Cl. .......................... 438/466; 438/468; 438/787; 324/765
[58] Field of Search ............................. 438/17, 622, 787, 438/468, 466; 324/765, 767

[56] References Cited

U.S. PATENT DOCUMENTS

| | | | |
|---|---|---|---|
| 4,007,294 | 2/1977 | Woods et al. | 438/474 |
| 4,014,772 | 3/1977 | Woods et al. | 204/192.22 |
| 4,047,974 | 9/1977 | Harari | 148/1.5 |
| 4,193,003 | 3/1980 | Blanchard et al. | 250/492 A |
| 4,983,255 | 1/1991 | Gruenwald et al. | 134/1.1 |
| 5,241,186 | 8/1993 | Yunogami et al. | 250/492.3 |
| 5,308,791 | 5/1994 | Horiike et al. | 437/173 |
| 5,393,686 | 2/1995 | Yeh et al. | 437/45 |
| 5,394,101 | 2/1995 | Mitros | 324/769 |
| 5,476,816 | 12/1995 | Mautz et al. | 438/622 |
| 5,498,974 | 3/1996 | Verkuil et al. | 324/767 |
| 5,519,334 | 5/1996 | Dawson | 324/765 |
| 5,527,731 | 6/1996 | Yamamoto et al. | 437/105 |
| 5,570,031 | 10/1996 | Sasaki et al. | 324/750 |
| 5,619,459 | 4/1997 | Gilliam | 365/201 |
| 5,621,339 | 4/1997 | Kerth et al. | 327/65 |
| 5,635,410 | 6/1997 | Kusuda | 438/798 |
| 5,701,088 | 12/1997 | Fujimaki | 324/765 |

OTHER PUBLICATIONS

P. Burggraaf., "Plasma Deposition Production Trends", Semiconductor International, No. 3, Mar., 1980.

*Primary Examiner*—John F. Niebling
*Assistant Examiner*—Christopher Lattin
*Attorney, Agent, or Firm*—Whitham, Curtis & Whitham; William D. Sabo

[57] ABSTRACT

A semi conductor manufacturing process including uniform negative polarity wafer charging to remove or immobilize alkali ions such that the device becomes immune to their presence. The wafer is charged with a corona discharge at a 1MV/cm–2MV/cm bias field and low temperature (200° C.–300° C.) heating to bring mobile ions to the wafer's surface. Surface mobile ions are removed with a deionized (DI) water rinse or a standard sequential wafer wet cleaning step, immobilized with a normal gate (polysilicon) or metal contact formation step or both, thereby effectively removing mobile ions from the semiconductor structure.

11 Claims, 8 Drawing Sheets

MOBILE CHARGE IMMUNE PROCESS

BACKGROUND OF THE INVENTION

1. Field of the Invention

The present invention generally relates to semiconductor manufacturing processes and more particularly to a removing impurities from insulating layers during semiconductor chip manufacturing.

2. Background Description

Silicon device reliability degradation resulting from mobile charge $Q_m$ in the device structure is a well known problem. Alkali mobile ions, e.g., $Na^+$, $Li^+$ or $K^+$, are typical sources of $Q_m$. These alkali ions contaminate critical device oxide, particularly the gate oxide and, also, oxide covering the device perimeter. The ionic contamination results in mobile charges in the oxide.

The mobility of these ionic impurities is affected by bias and temperature, i.e., typical device operating conditions. Over time, device operation causes mobile ions to move through the oxide causing operational device functional characteristic variations, such as device threshold voltage shifts, subthreshold leakage and impaired device isolation. Circuits with affected devices can become unstable.

There are any number of steps in state of the art manufacturing processes that may be the source of these mobile alkali ions: oxidation steps, wet chemical process steps, reactive ion etching (RIE), photolithographic steps, chemical-mechanical-polish (CMP) steps, or chemical vapor deposition (CVD) process steps. Preventing ionic contamination from these alkali mobile ions is very difficult and expensive.

FIGS. 1A–C show mobile ions being formed in a cross-section of a semiconductor wafer during typical prior art semiconductor manufacturing steps, field effect transistor (FET) manufacturing steps in this example. In FIG. 1A, a semiconductor layer 50 has device regions 52 defined by thick isolation insulator regions 54. A thin gate oxide layer 56 is formed over the semiconductor layer 50.

FIG. 1B is an expanded view at a typical device region 52. In the expanded view of FIG. 1B, mobile ions 58 ($Q_m$) are trapped in the thick isolation insulator 54 and thin gate oxide 56. In this example, the mobile ions 58 are primarily positively charged ions, and primarily at the semiconductor-isolator interface, e.g., the oxide-silicon interface. Generally, mobile ions introduced at a given process step may locate at any depth in the dielectric. Thus, the structure of FIG. 1B shows a typical semiconductor wafer after gate oxide formation. Mobile ions 58 remain in the structure as a result of prior processing steps.

In FIG. 1C, a gate 60, e.g., polysilicon, is formed on the structure of FIG. 1B. The gate oxide layer 56 is etched away from thick isolation regions 54, leaving gate oxide 56' under gate 60. Mobile ions 58 remain in gate oxide 56' and in thick insulator regions 54.

Under normal device operation, bias voltages on the gate 60 eventually force the mobile ions 58 through the gate oxide 56'. The movement of these mobile ions 58 alters the FET's threshold voltage ($V_T$), making the FET unstable, in effect, giving the FET a time varying $V_T$. If the polysilicon gate bias voltage is positive, the mobile ions move towards the channel, shifting the $V_T$ more negative or, less positive and, vice versa.

Typical prior art approaches to resolving this mobile charge problem and its associated reliability degradation has been through controlling device contamination with wafer monitors and product kerf testing. However, because process monitors are expensive, only selective process tools are monitored.

Further, the lag between introduction of unwanted ions and discovering their existence from $Q_m$ test information is, typically, several days to weeks later, after the chip manufacturing process is nearly complete. In typical 0.5 μm technologies, the earliest kerf in-line test probe occurs at the end of device definition, after forming a first metal wiring layer. This can be well after ionic contamination. At this point, an entire lot, partially completed, may be scrapped due to this ionic contamination.

Thus, there is a need for methods for reducing mobile ion contamination in semiconductor manufacturing processes.

SUMMARY OF THE INVENTION

It is therefore a purpose of the present invention to improve semiconductor device stability.

It is another purpose of the present invention to reduce the number of mobile ions contaminating semiconductor chip insulating layers.

It is yet another purpose of the present invention to improve field effect transistor threshold voltage stability.

The present invention is a semiconductor manufacturing process including steps to remove or immobilize alkali ions such that the device becomes immune to their presence. In a preferred embodiment insulated gate semiconductor process, which may be what is typically known in the art as a CMOS or Bi-MOS process, after forming gate oxide, a corona discharge bias-temperature stress is applied to the partially processed wafer. This stress step first drives any mobile charge ($Q_m$) contaminant ions within the gate oxide to the surface of the oxide. Once at the oxide surface, the ionic alkali impurities of $Na^+$, $Li^+$, $K^+$, $Cl^-$ are eliminated or immobilized by cleaning or during gate polysilicon formation or metal alloy contact formation. In devices thus formed, ionic contaminants are removed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
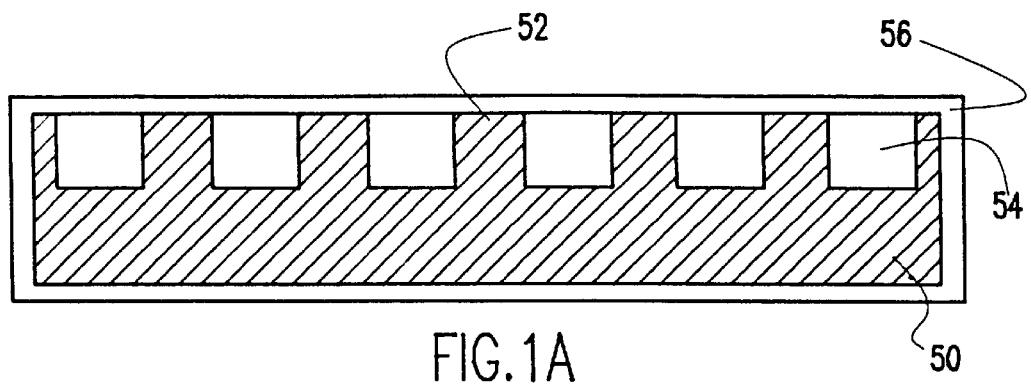
FIGS. 1A–C show mobile ions being introduced in a cross-section of a semiconductor wafer during typical prior art semiconductor manufacturing steps.
Figure 1B:
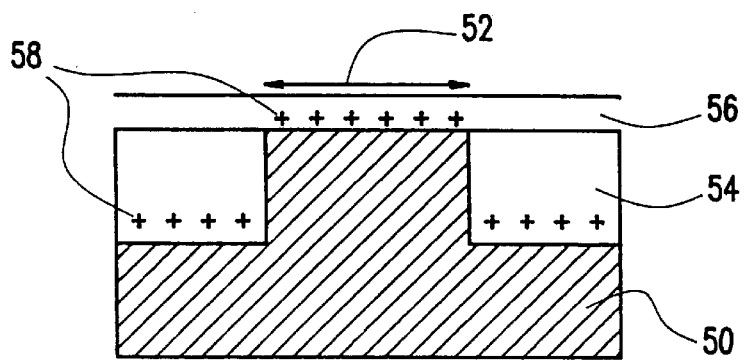
Figure 1C:
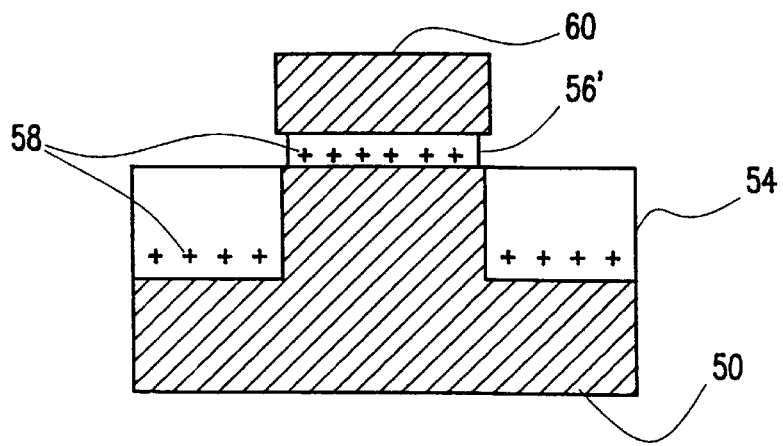
Figure 2:
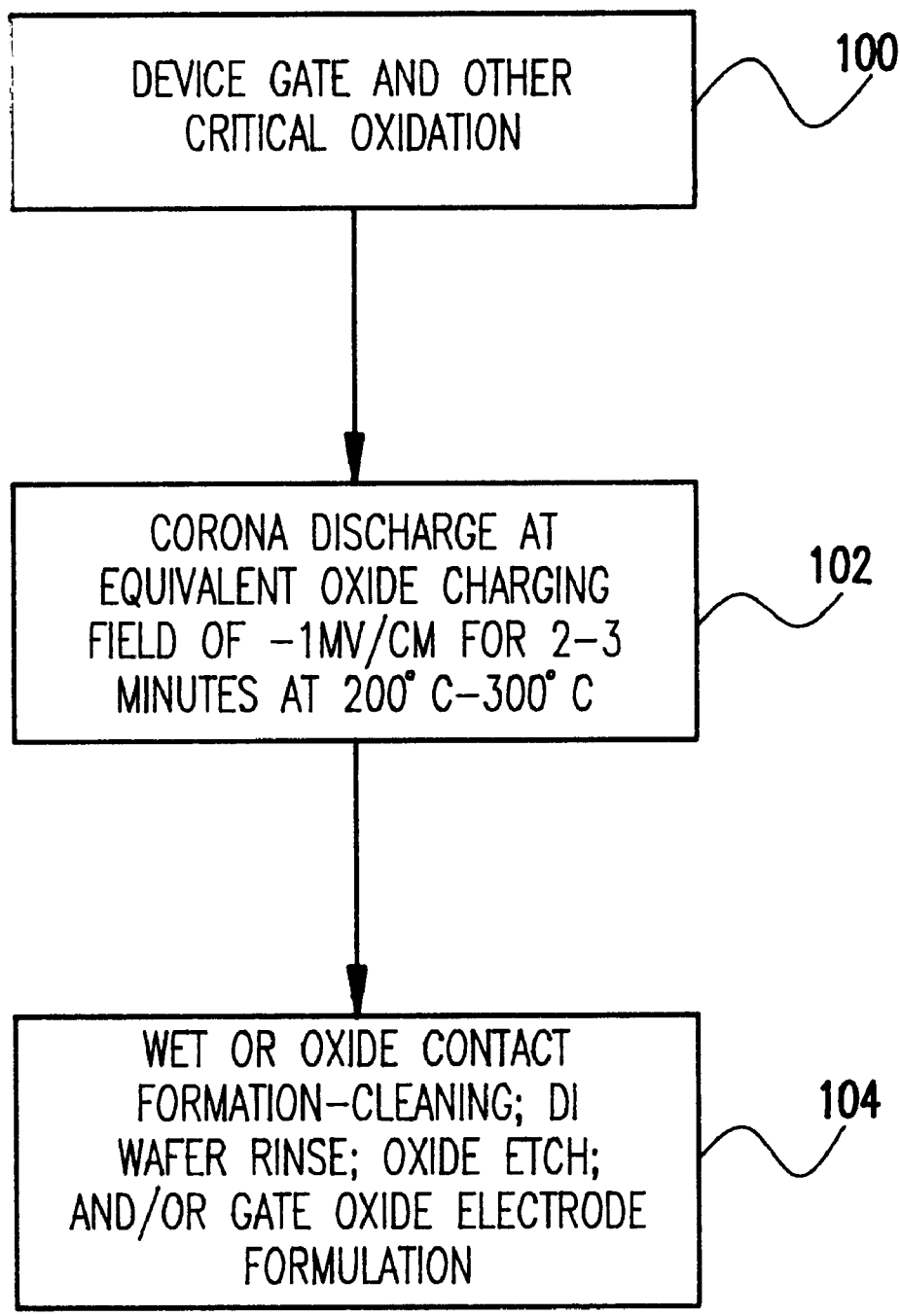
FIG. 2 shows a process flow the preferred embodiment Mobile Charge Immune process.

Referring now to the drawings, and more particularly to FIG. 2 which shows a process flow the preferred embodiment "Mobile Charge Immune" process, mobile ions are removed from partially processed semiconductor wafers. Thus, the preferred process includes a corona bias-temperature step to remove mobile ions. The corona bias-temperature step is done after typical device critical oxidation steps leading to a structure as in FIGS. 1A and 1B and, before proceeding with a wet step or an oxide contact formation step to form complete devices as in FIG. 1C. Thus, the preferred corona bias-temperature step draws mobile ions to the surface, while a wet step and/or an oxide contact formation step removes or neutralizes the surfaced mobile ions.

Thus, in step 100 of a preferred embodiment insulated gate semiconductor process, which may be what is typically known in the art as a CMOS or Bi-MOS process, a semiconductor wafer is processed normally up to gate formation or if, included, to an oxidation pre-clean step. At this point, the structure, which is similar to that in FIGS. 1A–B, is exposed to a corona discharging bias to draw ionic contaminants in the gate oxide to the surface of the oxide in step 102. Temperature may be elevated during or subsequent to corona discharge biasing. Then, in step 104, wafer processing continues normally, resulting in a structure wherein unlike FIG. 1C, mobile ions 58 have substantially been neutralized or removed.

In the corona discharge bias-temperature step 102, the preferred cumulative charge density for an equivalent oxide charge field is –1MV/cm to –2MV/cm. This charge field can be achieved with a uniform deposition of bias charge from a negative corona discharging ambient air molecules. Thus a constant charge density of $-Q/A = -2.2 \times 10^{12} q/cm^2 = -1MV/cm$ is maintained, preferably, in a multi-needle (tungsten) corona discharging apparatus.

U.S. Pat. No. 5,498,974 entitled "Contactless Corona-Oxide-Semiconductor Q-V Mobile Charge Measurement Method and Apparatus" to Verkuil et al., which is incorporated herein by reference, teaches using a corona charge for oxide bias field for mobile charge $Q_m$ measurement. The apparatus of Verkuil et al. is a single or dual needle corona gun, which may be aimed to locally bias a site on a wafer.

Figure 3A:
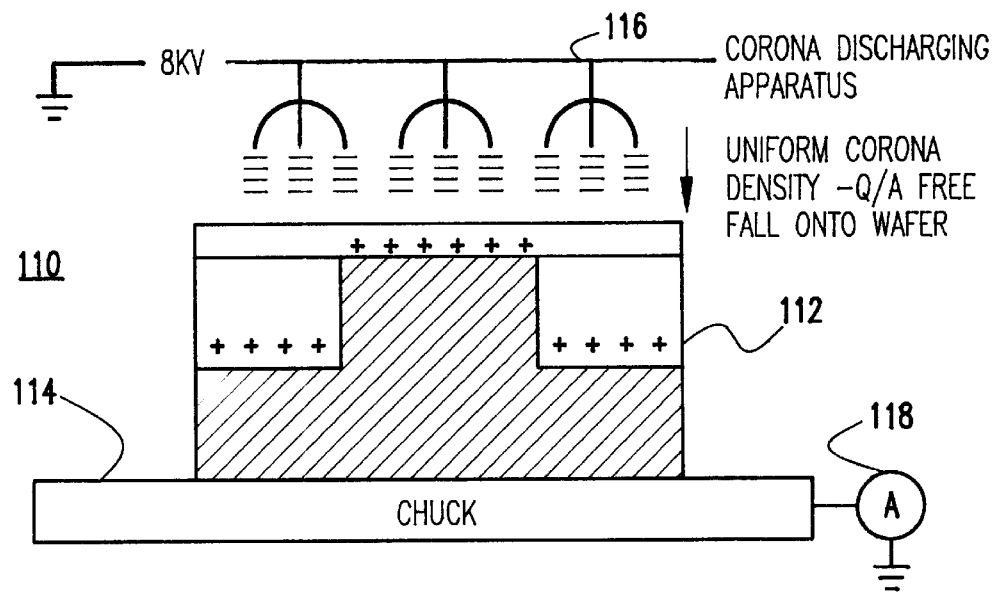
FIG. 3A shows an arrangement wherein a corona bias is generated and directed to a wafer according to the preferred embodiment.
Figure 3B:
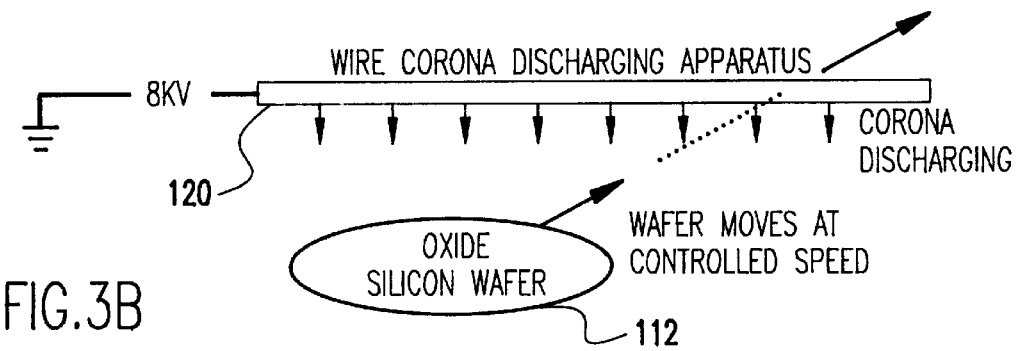
FIG. 3B shows an alternate arrangement wherein a corona bias is generated using a wire corona discharging apparatus and directed to a wafer.

Preferably, the apparatus of FIG. 3A or 3B is used in a bias-temperature stress step relying on physical principles similar to that used for determining mobile charge in a semiconductor structure in the method of Verkuil et al. to move charged ions to the oxide surface. The preferred apparatus of FIGS. 3A and 3B biases the entire wafer, simultaneously.

Figure 3C:
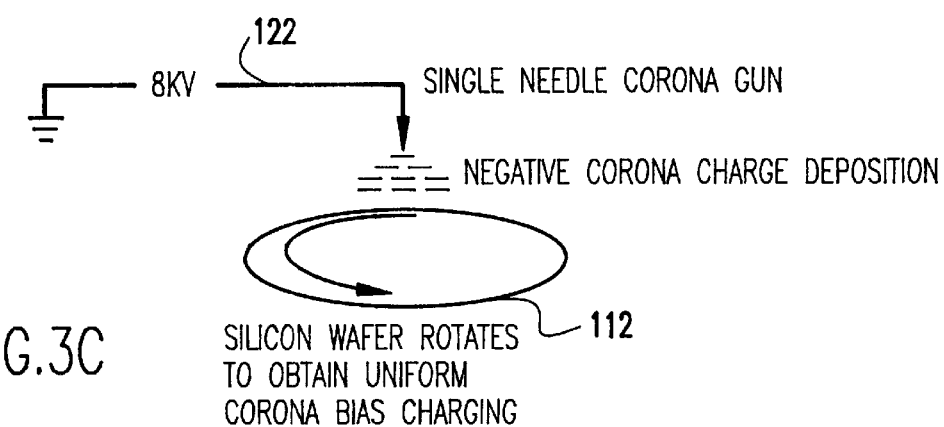
FIG. 3C shows another alternate arrangement wherein a corona bias is generated using a needle corona gun and directed to a rotating wafer.

Thus, in FIG. 3A, an apparatus such as in Verkuil et al. is used in arrangement 110 after gate oxidation step 100, to generate a corona bias which is directed to the wafer 112. The wafer 112, represented by device structure, is held on a wafer chuck 114, where it is subjected to bias-temperature conditions of –1MV/cm at 200° C.–300° C. for 2–3 minutes. A timed constant corona current, generated by corona discharging apparatus 116, is measured by meter 118 at the wafer chuck 114. As noted above to achieve a uniform charge across the wafer 112, a multiple corona ion gun 116 is preferred. Alternatively, in FIG. 3B, whole wafer 112 charging may be achieved using a well known wire corona discharging apparatus 120 or, in FIG. 3C, using a needle corona gun 122 while rotating the wafer.

Figure 4:
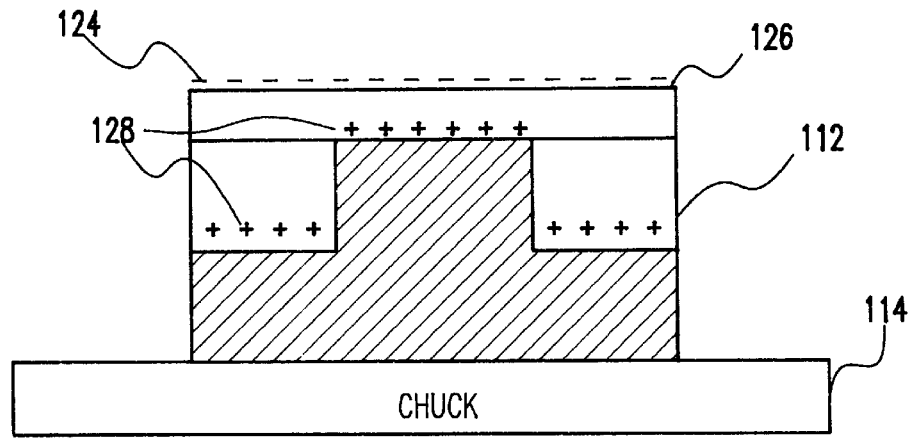
FIG. 4 shows the wafer after the corona biasing.

FIG. 4 shows the wafer 112 after the corona biasing. A negative surface charge 124 remains on the wafer surface 126 and mobile ions 128 remain in the surface oxide. For a charged field of –1MV/cm to –2MV/cm, $Q_m$ is still not readily mobile until the wafer 112 is heated to above 200° C. For the preferred embodiment, the wafer 112 may be heated on a heat chuck at 200° C.–300° C., either coincident with or subsequent to corona charge deposition, preferably for 2–3 min.

Figure 5:
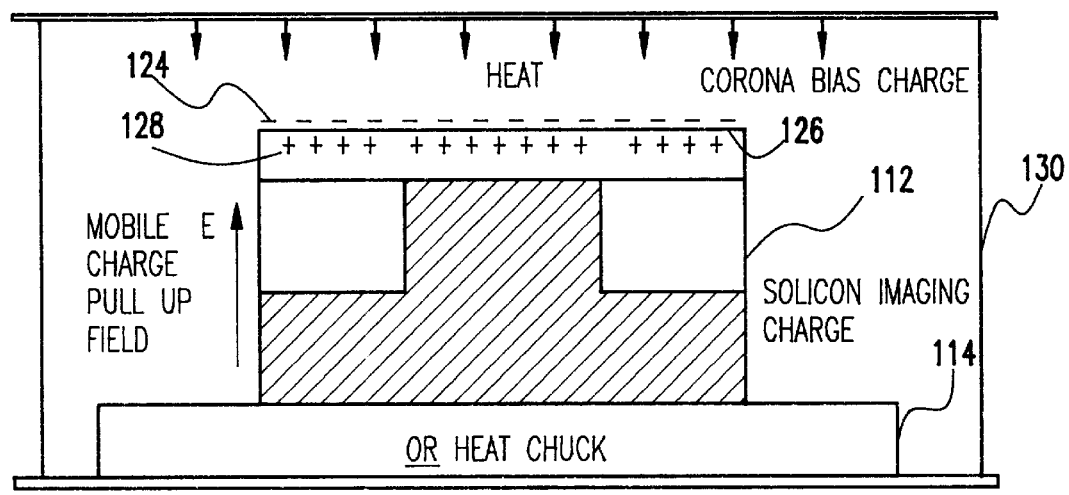
FIG. 5 shows an optional rapid thermal anneal (RTA) step to heat the wafer as opposed to using a heat chuck for heating.

Optionally, in FIG. 5, a rapid thermal anneal (RTA) step in chamber 130 may be included to heat the wafer 112 instead of heating by a heat chuck. The RTA step may be for whatever time is determined appropriate for the particular semiconductor process. Thus, as both bias and heating are applied, either coincidentally or sequentially, the $Q_m$ in surface oxide moves up to the top of the oxide surface 126.

Figure 6:
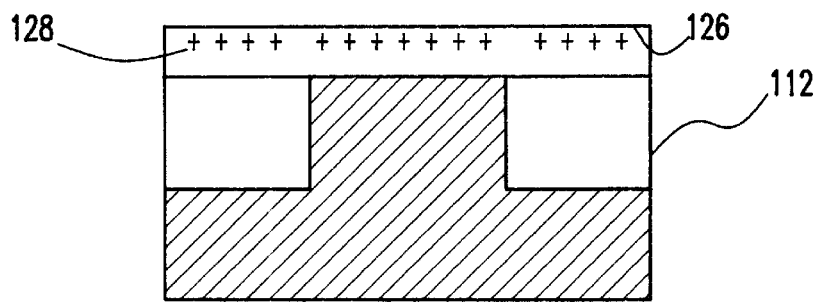
FIG. 6 shows the wafer after drawing ions to the oxide surface with mobile ions removed after a preferred embodiment corona $Q_m$ pull-up stress step.

After drawing ions to the oxide surface with the corona $Q_m$ pull-up stress, the surface corona charge is removed, providing the structure of FIG. 6. Removal may be by one of several methods. Surface corona charge may be removed using a charge neutralization step wherein a second corona deposition of opposite polarity at the same charge level +Q/A is done at completion of $Q_m$ pull up, but without heating to avoid driving $Q_m$ back in. If the step 104, subsequent to $Q_m$ pull up is a wet step, a separate corona bias neutralization step is unnecessary.

Instead, the corona bias may be removed coincident with $Q_m$ removal during the wet wafer pre-clean in step 104. The wafer may be washed with a deionized (DI) water rinse or a standard sequential wet wafer cleaning step prior to gate contact processing. Preferably, a standard sequential wafer cleaning rinse is used that includes light oxide etching to strip away the upper surface of the oxide, removing both corona charge and $Q_m$ with it. A typical such sequential cleaning step is a first rinse with $H_2SO_4$ and $H_2O_2$ in $H_2O$, followed by a solution of $NH_4OH$ and $H_2O_2$ in $H_2O$ and, finally, with HCl and $H_2O_2$ in $H_2O$. If desired an additional rinse with dilute or vapor HF may be included.

In addition to or, as an alternative to $Q_m$ removal, the mobile charge trapped at the oxide-gate contact interface can be immobilized at an oxide-to-gate poly or a metal-metal contact step after gate contact formation. Thus, after bias-temperature stress and gate contact formation, the alkali ions are immobile. However, regardless of whether the mobile ions are removed or immobilized, device reliability degradation that occurred in prior art devices due to the presence of these alkali ions is largely eliminated.

Experimental Results

Figure 7A:
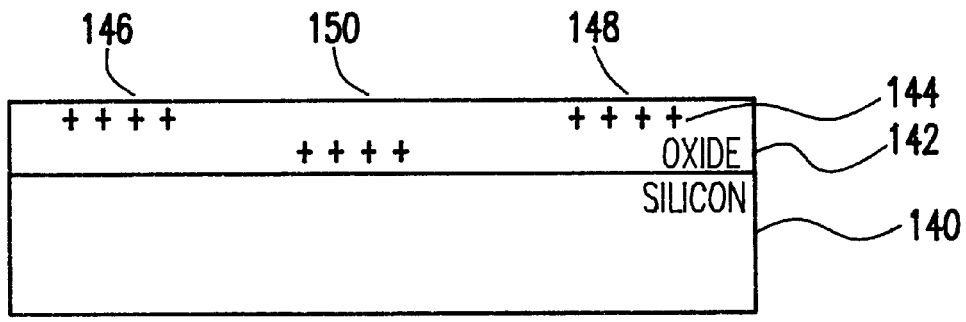
FIG. 7A, shows a cross section of an experimental wafer contrasting a preferred embodiment corona $Q_m$ pull-up stress step on one portion of a wafer with a $Q_m$ push-down on another portion.

A first experiment demonstrated that mobile charges can be trapped at a gate electrode-to-oxide interface. Two wafers were separately processed to form surface oxide, both having $Q_m$ contamination which was introduced during oxidation. FIG. 7A represents a cross section of one such experimental wafer 140 with an oxide layer 142 formed on one surface. Mobile ions 144 in the oxide layer were subjected to a corona bias-temperature stress step to pull up or push down these mobile charges, $Q_m$ in selected areas.

Thus, after oxide formation the wafers were corona bias-temperature stressed, pulling the mobile ions 144 up in a first region 146 using a –Q/A corona bias. In a second region 150 the mobile ions 144 were pushed down by a +Q/A corona bias. A third region, control region 148, was left unbiased. After corona biasing, both wafers were uniformly heated to 200° C.

Figure 7B:
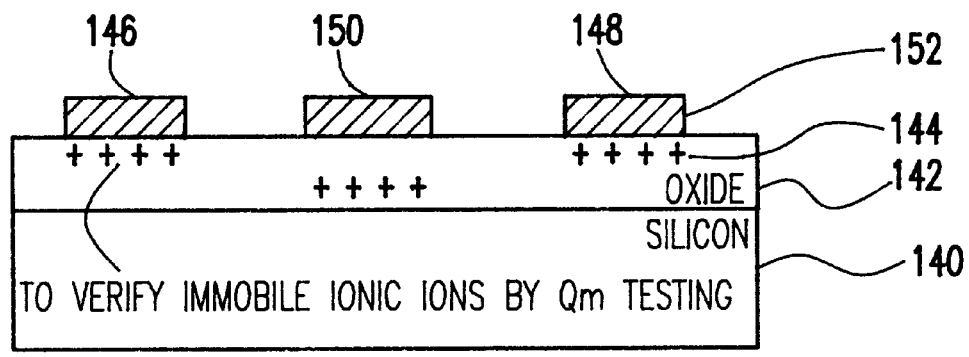
FIG. 7B shows gates formed on the wafer of FIG. 7A and aluminum contacts formed at the gates.

Next, as represented in FIG. 7B, gates 152 were formed on the wafer and metal contacts of aluminum were formed at the gates. Finally, mobile charge was measured in each of the three regions 146, 148 and 150 using a well known MOS Pulsed QV technique.

Figure 8A:
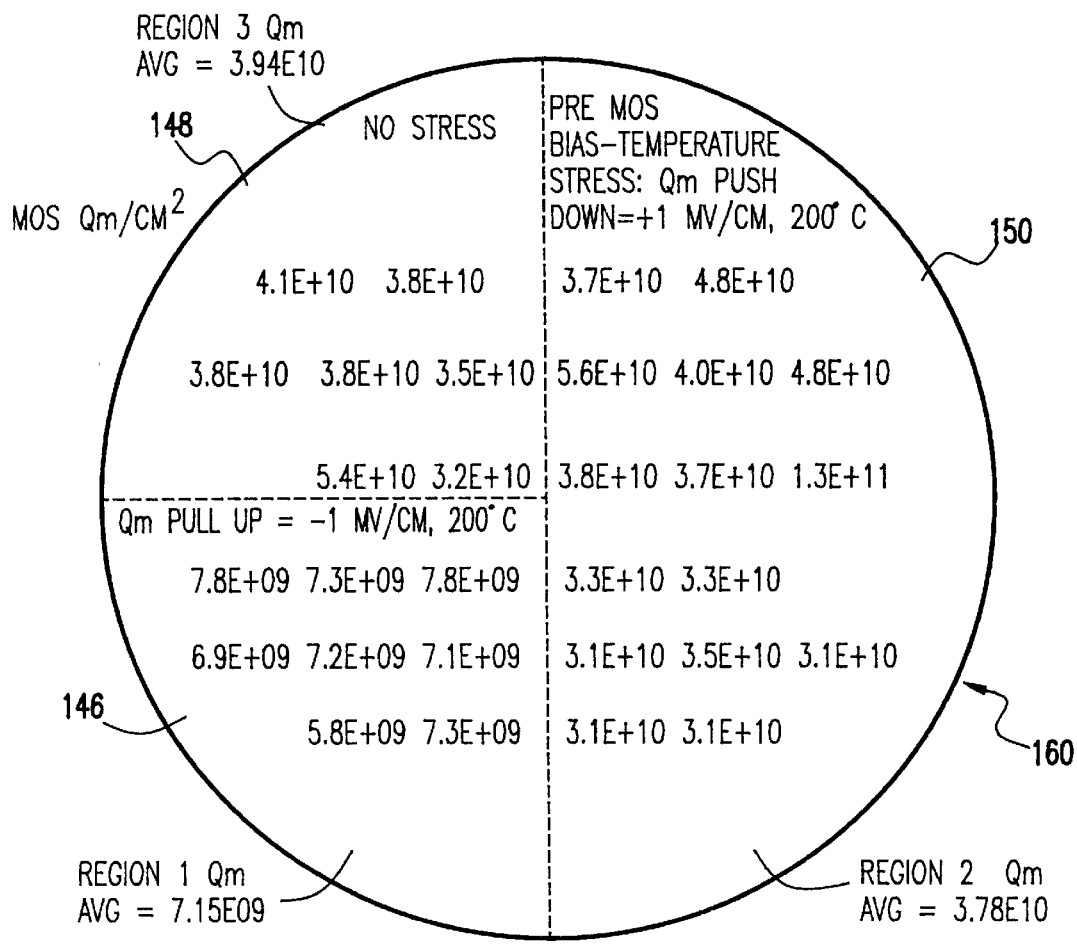
FIGS. 8A–C are wafer maps of experimental wafers.
Figure 8B:
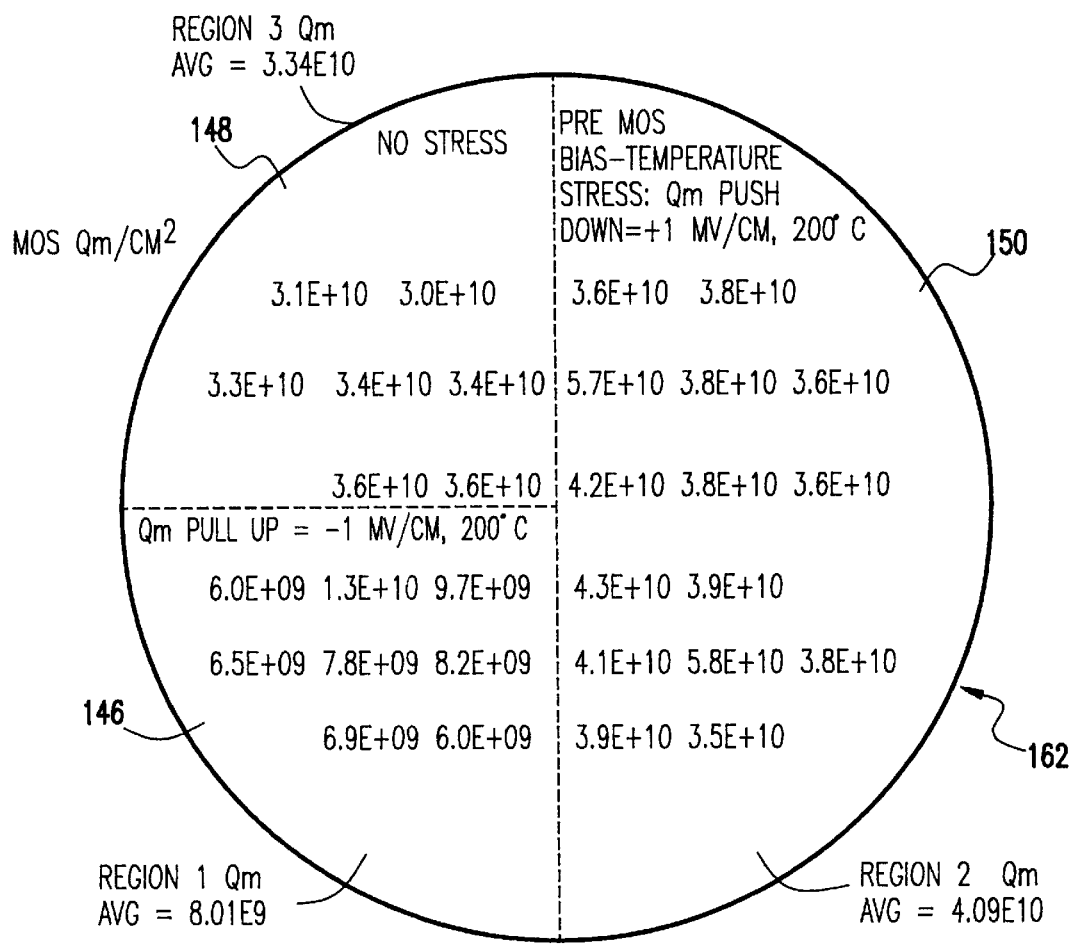

FIGS. 8A and 8B show wafer maps for both experimental wafers 160, 162. As is apparent the average $Q_m$ in the first Region 146, which was treated according to the preferred embodiment, was measured at $7.15 \times 10^9$ charges/cm$^2$ on wafer 160 and $8.01 \times 10^9$ charges/cm$^2$, on wafer 162, where "charges" refers to the number of electron charges in $1.6 \times 10^{-19}$ coulombs. In the second region 150, where ions were pushed down from the oxide surface, the average $Q_m$ was measured at $3.78 \times 10^{10}$ charges/cm$^2$ on wafer 160 and $4.09 \times 10^{10}$ charges/cm$^2$, on wafer 162. In untreated control region 148, the average $Q_m$ was measured at $3.94 \times 10^{10}$ charges/cm$^2$ on wafer 160 and $3.34 \times 10^{10}$ charges/cm$^2$, on wafer 162. Thus, $Q_m$ was reduced by the preferred embodiment method to less than twenty percent (20%) that of second region 150 or control region 148.

Figure 8C:
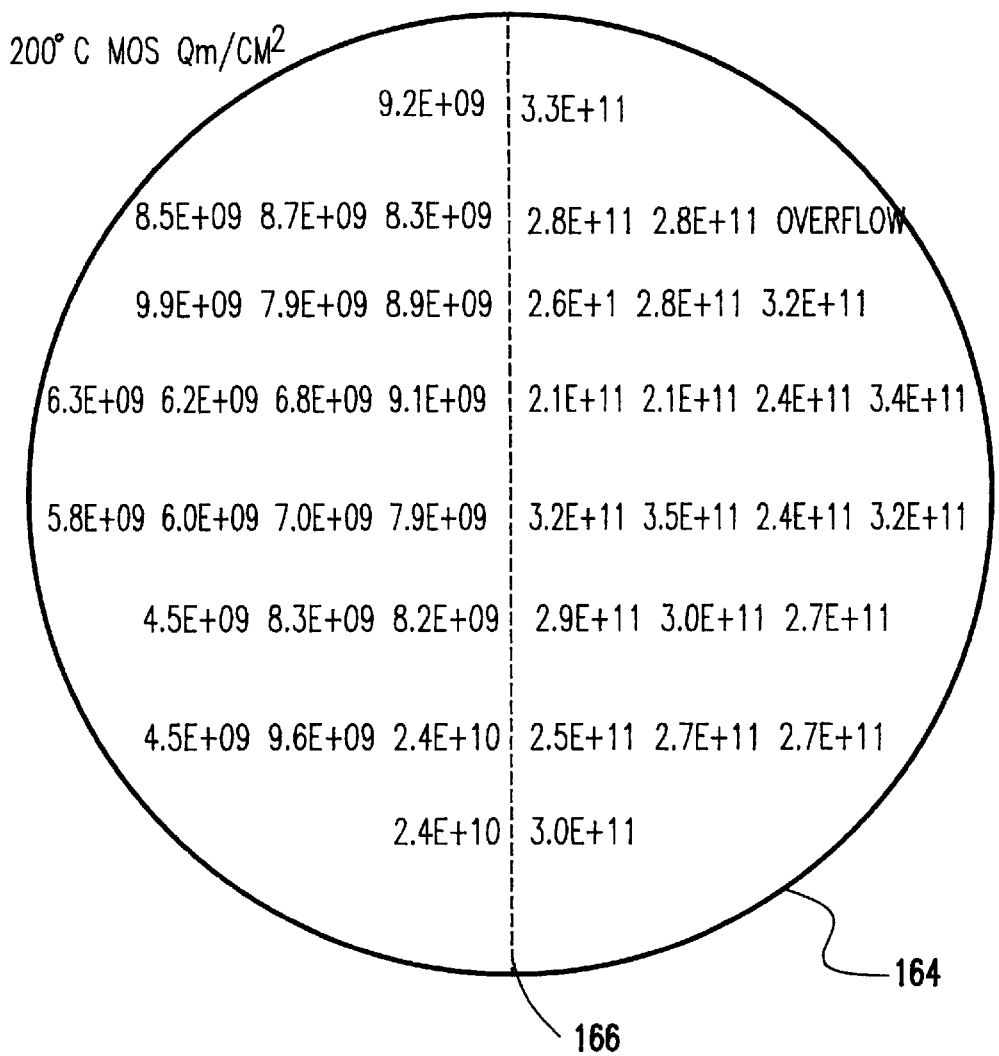

FIG. 8C is wafer map of an additional control example with respect to the power of ionic trapping at the oxide-electrode interface on wafer 164. On wafer 164 the inventors purposely contaminated oxide by applying a photo resist known for high levels of mobile ionic species to the wafer's surface. Then, the resist was dry etched (ASHed) away without a post ASH clean, leaving a higher than normal residual concentration of mobile ions at the surface. During a typical semiconductor manufacturing process mobile ions may be introduced at any point in the process and will, therefore, be found throughout the oxide, not just at the surface. So, to simulate typical mobile ion contamination, the residual surface mobile ions were pushed down on the half of the wafer to the right of line 166 using a positive corona bias-temperature stress step. Then, the wafer was heated, followed by a typical MOS metal electrode process step.

| $T_{ox}$ (Å) | Process | Site | Pre-Rinse | Post-Rinse | Comments |
|---|---|---|---|---|---|
| 588 | Furnace | 1 | 2.21 × 10$^{10}$ | 1.41 × 10$^{10}$ | -COS left site 1&2 $Q_m$ at top after test. |
|  | TCA oxide | 2 | 2.00 × 10$^{10}$ | 1.86 × 10$^{10}$ | This is cleaned after rinse. |
|  |  | 3 |  | 2.16 × 10$^{10}$ | - Site 3 was not tested in pre-rinse. |
| 440 | Furnace | 1 | 1.26 × 10$^{10}$ | 5.93 × 10$^{9}$ |  |
|  | No TCA | 2 | 1.06 × 10$^{10}$ | 3.12 × 10$^{9}$ |  |
|  |  | 3 |  | 1.20 × 10$^{10}$ |  |
| 500 | oxide | 1 | 1.06 × 10$^{11}$ | 1.23 × 10$^{11}$ | -COS left site 1&2 $Q_m$ at top after test. |
|  | Nitride | 2 | 1.03 × 10$^{11}$ | 1.23 × 10$^{11}$ | Nitride cap prevents $Q_m$ move to the top and to |
|  |  | 3 |  | 1.09 × 10$^{11}$ | be cleaned by water rinse. |
| 600 | P/R | 1 | 4.18 × 10$^{11}$ | 2.62 × 10$^{11}$ | Resist Ash left on $Q_m$ at oxide surface. |
|  | ASH | 2 | 4.58 × 10$^{11}$ | 1.75 × 10$^{11}$ |  |
|  | No Clean | 3 |  | 1.52 × 10$^{11}$ | Same $Q_m$ cleaned by rinse everywhere. |
| 3200 | Furnace | 1 | 4.10 × 10$^{11}$ | 1.77 × 10$^{11}$ | Same as above. |
|  | $Q_m$ | 2 | 6.00 × 10$^{11}$ | 4.51 × 10$^{11}$ |  |
|  | No Clean | 3 |  | 2.70 × 10$^{11}$ |  |

Then, mobile ions in the surface oxide from the resist were measured using the MOS technique. Because mobile ions to the left of line 166 remained at the surface and were removed, neutralized or immobilized during subsequent processing, the measured $Q_m$ is 30× lower on the top or, unstressed, oxide surface than on the pushed down right half.

In a second experiment, the corona pull-up process step of the preferred embodiment is followed with a subsequent wet process step 104 for $Q_m$ removal. For this second experiment, $Q_m$ was measured using the technique of Verkuil et al. on 5 wafers after forming gate oxide. The technique of Verkuil et al. does not require an electrode for a measurement contact and the wafers were measured both before and after a DI water rinse step and is shown in the table above. In the Verkuil technique, the $Q_m$ measurement includes a bias stress similar to the preferred embodiment $Q_m$ pull-up step. Thus, the "pre-rinse" $Q_m$ in charges/cm$^2$ in the above table is the initial $Q_m$ prior to stress and rinse. The preferred embodiment $Q_m$ pull-up step is done simultaneously with this "pre-rinse" measurement. Then, after a DI water rinse to remove the $Q_m$ pulled to the surface, the resulting "post-rinse" $Q_m$ measurement was made, again in charges/cm$^2$. Thus, the above tabular results show that the DI water rinse removes approximately half of the $Q_m$ at the oxide surface.

Additionally, control wafers with oxide capped with nitride did not exhibit reduced $Q_m$. The nitride acted as a barrier, preventing $Q_m$ from moving from the surface of the oxide through the nitride.

Conclusions

Thus, insulated gate transistor chips manufactured according to the preferred embodiment semiconductor process of the present invention have the damaging effects of mobile ionic charges substantially reduced over prior art chips. Further, the process of the present invention is a relatively simple, low cost solution to mobile ion induced reliability problems.

While the invention has been described in terms of preferred embodiments, those skilled in the art will recognize that the invention can be practiced with modification within the spirit and scope of the appended claims.

What is claimed is:

1. A process for reducing the deleterious effects of mobile ionic charges in semiconductor device insulators, said process comprising the steps of:
   applying a corona discharge bias to an insulator surface on a semiconductor wafer, said corona discharge bias creating a charge being opposite in polarity to mobile ions having an ionic charge in said insulator surface;
   heating said semiconductor wafer to move said mobile ions to said insulator surface; and
   washing said ions from said insulator surface.

2. The process of claim 1 wherein the step of applying the charge further comprises heating the wafer as the charge is applied.

3. The process of claim 1 wherein said charge generates an electric field between −1MV/cm to −2MV/cm.

4. The process of claim 3 wherein in said step of heating, said semiconductor wafer is heated to 200° C.–300° C.

5. The process of claim 1 wherein the step of washing the mobile ions from the insulator surface comprises washing the insulator surface with deionized water.

6. The process of claim 1 further comprising the step of:
forming a gate layer after said washing step.

7. The process of claim 1 wherein the step of washing the mobile ions from the insulator surface comprises the steps of:
1) washing the insulator surface with a solution of $H_2SO_4$ and $H_2O_2$ in $H_2O$;
2) washing the insulator surface with a solution of $NH_4OH$ and $H_2O_2$ in $H_2O$; and,
3) washing the insulator surface with a solution of HCl and $H_2O_2$ in $H_2O$.

8. The process of claim 7 further comprising the step of washing the wafer in a solution including HF.

9. The process of claim 1 further comprising the step of:
forming metal contacts through said insulator surface.

10. A process for removing mobile ionic charges formed after an oxidation step in a semiconductor device insulator, comprising the steps of:
subjecting a semiconductor device insulator on a wafer to a corona discharge, said corona discharge creating a bias charge on a surface of said insulator being opposite in polarity to said mobile ionic charges of ions in said insulator;
heating said wafer to move said ions to said insulator surface; and
removing said ions from said insulator surface by washing said insulator surface with deionized water.

11. A process for removing mobile ionic charges formed after an oxidation step in a semiconductor device insulator as recited in claim 10 wherein said washing step comprises the steps of:
washing the insulator surface with a solution of $H_2SO_4$ and $H_2O_2$ in $H_2O$;
washing the insulator surface with a solution of $NH_4OH$ and $H_2O_2$ in $H_2O$; and,
washing the insulator surface with a solution of HCl and $H_2O_2$ in $H_2O$.

* * * * *